United States Patent
Do

(10) Patent No.: US 10,734,426 B2
(45) Date of Patent: Aug. 4, 2020

(54) IMAGE SENSOR INCLUDING TRANSMITTING LAYERS HAVING LOW REFRACTIVE INDEX

(71) Applicant: SK hynix Inc., Gyeonggi-do (KR)

(72) Inventor: Youngwoong Do, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/221,230

(22) Filed: Dec. 14, 2018

(65) Prior Publication Data
US 2019/0319060 A1    Oct. 17, 2019

(30) Foreign Application Priority Data

Apr. 11, 2018  (KR) .................. 10-2018-0042189

(51) Int. Cl.
| | | |
|---|---|---|
| *H01L 29/80* | (2006.01) | |
| *H01L 31/0288* | (2006.01) | |
| *H01L 27/146* | (2006.01) | |
| *H04N 5/232* | (2006.01) | |
| *H04N 5/378* | (2011.01) | |
| *H04N 5/376* | (2011.01) | |

(52) U.S. Cl.
CPC .... *H01L 27/14627* (2013.01); *H01L 27/1463* (2013.01); *H01L 27/14621* (2013.01); *H01L 27/14645* (2013.01); *H04N 5/232122* (2018.08); *H04N 5/378* (2013.01); *H04N 5/3765* (2013.01)

(58) Field of Classification Search
CPC ......... H01L 27/14627; H01L 27/14621; H01L 27/1463; H01L 27/14645; H04N 5/232122; H04N 5/3765; H04N 5/378
USPC ........................................................ 257/432
See application file for complete search history.

(56) References Cited

U.S. PATENT DOCUMENTS

| | | | |
|---|---|---|---|
| 8,669,134 B2 | 3/2014 | Ito et al. | |
| 9,634,058 B2 | 4/2017 | Miyashita | |
| 9,780,139 B2 | 10/2017 | Tayanaka et al. | |
| 2006/0054946 A1* | 3/2006 | Baek ................. | H01L 27/14627 257/292 |
| 2016/0343753 A1 | 11/2016 | Asatsuma | |
| 2017/0110501 A1* | 4/2017 | Hsu .................... | H01L 27/14645 |
| 2019/0296069 A1* | 9/2019 | Yang .................. | H01L 27/14645 |

* cited by examiner

*Primary Examiner* — David S Blum
(74) *Attorney, Agent, or Firm* — Perkins Coie LLP

(57) ABSTRACT

An image sensor is provided to include image pixels and phase difference detection pixels. The image pixels may include image photodiodes formed in a substrate; color filters formed over the substrate and vertically overlapping with the image photodiodes; and image micro lenses over the color filters. The phase difference detection pixels may include phase difference detection photodiodes formed in the substrate; transmitting layers formed over the substrate and vertically overlapping with the phase difference detection photodiodes; guide patterns formed between the substrate and the transmitting layers; and phase difference detection micro lenses over the transmitting layers. The transmitting layers may have a refractive index lower than the color filters and the phase difference detection micro lenses.

19 Claims, 15 Drawing Sheets

FIG. 2

| R | G1 | R | G1 | R | G1 | R | G1 | R | G1 |
|---|----|---|----|---|----|---|----|---|----|
| G2 | B | G2 | B | G2 | B | G2 | B | G2 | B |
| R | G1 | R | G1 | R | G1 | R | G1 | R | G1 |
| G2 | B | G2 | B | G2 | B | G2 | LP | G2 | B |
| R | G1 | R | G1 | R | G1 | R | G1 | R | G1 |
| G2 | B | G2 | B | G2 | B | G2 | B | G2 | B |
| R | G1 | R | G1 | R | G1 | R | G1 | R | G1 |
| G2 | B | G2 | B | G2 | B | G2 | RP | G2 | B |
| R | G1 | R | G1 | R | G1 | R | G1 | R | G1 |
| G2 | B | G2 | B | G2 | B | G2 | B | G2 | B |

100
200L
200R

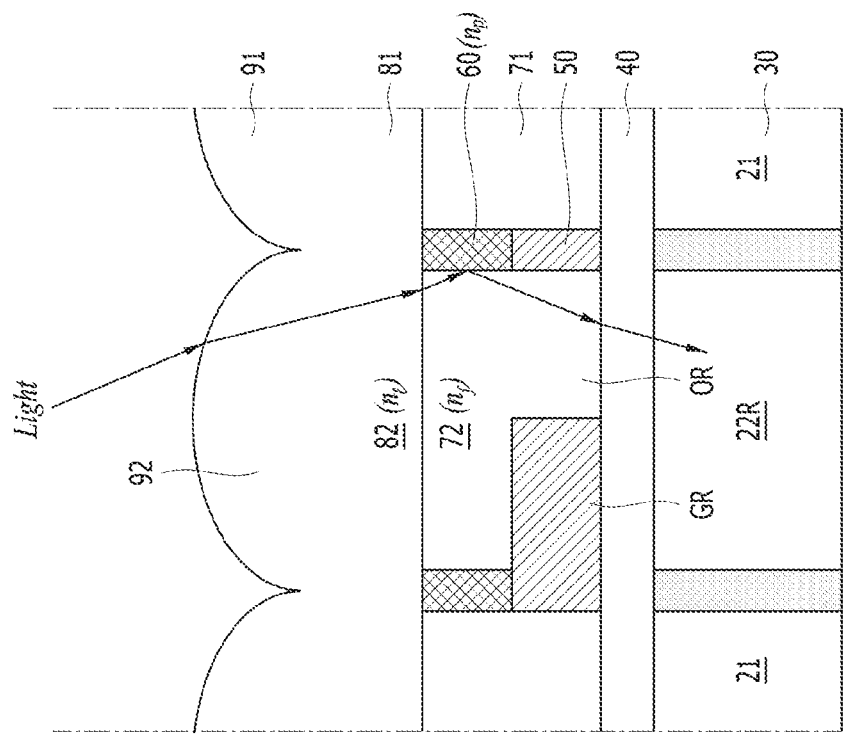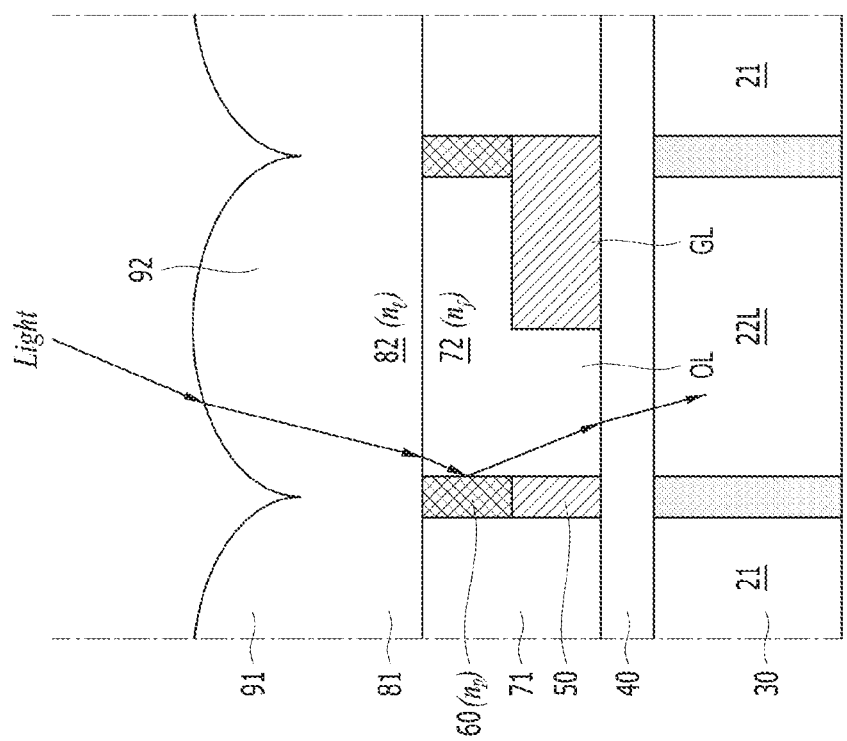

IMAGE SENSOR INCLUDING TRANSMITTING LAYERS HAVING LOW REFRACTIVE INDEX

CROSS-REFERENCE TO RELATED APPLICATION

This patent document claims priority under 35 U.S.C. § 119 to Korean Patent Application No. 10-2018-0042189 filed on Apr. 11, 2018, which is incorporated herein by reference in its entirety.

TECHNICAL FIELD

The technology and implementations disclosed in this patent document relate to an image sensor including an image sensor including image pixels and phase difference detection pixels.

BACKGROUND

With the recent development of the information communication industry and the digitalization of electronic devices, image sensors with improved performance have been used in various fields such as a digital camera, a camcorder, a mobile phone, a PCS (personal communication system), a game machine, security camera and a medical micro camera.

SUMMARY

Various embodiments are directed to an image sensor having a low refractive index.

Various embodiments are directed to an image sensor further including a transmitting layer having a low refractive index.

Various objects in specific implementations of the disclosed technology may be achieved and the applications of the disclosed technology are not limited to the specific implementations or examples disclosed in this patent document.

In one aspect, image pixels and phase difference detection pixels, the image pixels comprising image photodiodes formed in a substrate; color filters formed over the substrate and vertically overlapping with the image photodiodes; and image micro lenses over the color filters, the phase difference detection pixels comprising phase difference detection photodiodes formed in the substrate; transmitting layers formed over the substrate and vertically overlapping with the phase difference detection photodiodes; guide patterns formed between the substrate and the transmitting layers; and phase difference detection micro lenses over the transmitting layers, wherein the transmitting layers have a refractive index lower than the color filters and the phase difference detection micro lenses.

In another aspect, an image sensor may include a substrate, image pixels formed in the substrate to detect incident light into to provide optical image information and phase difference detection pixels formed in the substrate and located differently from the image pixels to detect light provide phase differences information for the optical image information provided by the image pixels. The image pixels may include image photodiodes formed in the substrate; color filters formed over the substrate and vertically overlapping with the image photodiodes to transmit light of certain selected colors to corresponding image photodiodes, respectively; and image micro lenses over the color filters. The phase difference detection pixels may include phase difference detection photodiodes formed in the substrate; a transmitting layers formed over the substrate to allow optical transmission of light and patterned to vertically overlap with the phase difference detection photodiodes, respectively; guide patterns formed between the substrate and the transmitting layers and structured to be optically opaque to block light incident to the guide patterns; and phase difference detection micro lenses formed over the transmitting layers to direct incident light to the phase difference detection photodiodes, respectively. The transmitting layers may have a refractive index lower than those of the color filters and the phase difference detection micro lenses.

In some implementations, wherein the phase difference detection photodiodes comprise a left phase difference detection photodiode and a right phase difference detection photodiode, wherein the guide patterns comprise a left guide pattern and a right guide pattern, and wherein the left guide pattern blocks a portion of the left phase difference detection photodiode, and the right guide pattern covers a portion of the right phase difference detection photodiode. In some implementations, the transmitting layers include a polymeric material, including at least one of a polystyrene-based resin, a polyimide-based resin, a polysiloxane-based resin, an acrylic-based resin, an epoxy-based resin, or a copolymer resin thereof. In some implementations, the image sensor further comprises: grid patterns formed between the color filters and the transmitting layers, wherein the grid patterns and the guide patterns include a same material that is optically opaque. In some implementations, side surfaces of the grid patterns are in contact with lower portions of the color filters and lower portions of the transmitting layers. In some implementations, the image sensor further comprises: partition patterns over the grid patterns, wherein side surfaces of the partition patterns are in contact with upper portions of the color filters and upper portions of the transmitting layers.

In some implementations, the partition patterns have a refractive index lower than that of the color filters. In some implementations, the partition patterns include a silicon oxide. In some implementations, the phase difference detection pixels further comprise: blind regions blocked by the left and right guide patterns, and openings not blocked by the left and right guide patterns; and partition patterns over the grid patterns between the color filters and the transmitting layers which are adjacent to the openings, and wherein the partition patterns have a refractive index lower than that of the color filters. In some implementations, the partition patterns have a refractive index higher than that of the transmitting layers. In some implementations, the image sensor further comprises: image overcoat layers formed between the color filters and the image micro lenses; and phase difference detection overcoat layers formed between the transmitting layers and the phase difference detection micro lenses, wherein the phase difference detection overcoat layers have a refractive index higher than the transmitting layers. In some implementations, the image overcoat layers, the phase difference detection overcoat layers, the image micro lenses and the phase difference detection micro lenses have a same refractive index.

In an embodiment, an image sensor may include isolation patterns formed in a substrate and defining areas for image photodiodes and phase difference detection photodiodes; an antireflection layer formed over the substrate; grid patterns formed over the antireflection layer and vertically aligned with the isolation patterns; color filters and transmitting layers formed over the antireflection layer between the grid patterns, the color filters vertically overlapping with the image photodiodes and the transmitting layers vertically overlapping with the phase difference detection photodiodes; overcoat layers over the color filters and the transmitting layers; and micro lenses over the overcoat layers. The transmitting layers may have a refractive index lower than the color filters and the micro lenses.

In some implementations, the image sensor further comprises: guide patterns interposed between the antireflection layer and the transmitting layers to block portions of the phase difference detection photodiodes, wherein the portions blocked by the guide patterns provide blind regions and the guide patterns are disposed to provide openings between the guide patterns and the grid patterns. In some implementations, the image sensor further comprising: partition patterns formed over the grid patterns, wherein the grid patterns and the partition patterns separate the color filters from the transmitting layers. In some implementations, the partition patterns surround side surfaces of the transmitting layers. In some implementations, the partition patterns include a silicon oxide. In some implementations, the partition patterns have a refractive index lower than the color filters. In some implementations, the image sensor further comprises: partition patterns over the grid patterns which are adjacent to the openings, and wherein the partition patterns have a refractive index lower than the color filters, the overcoat layers and the micro lenses. In some implementations, the transmitting layers have a refractive index lower than the micro lenses.

The details of other embodiments are included in the detailed description and the drawings.

According to the embodiments of the disclosed technology, since phase difference detection pixels may receive more light, a phase difference detection efficiency may be increased.

According to the embodiments of the disclosed technology, since image pixels may receive more light, a light efficiency and a resolution may be increased.

Other advantages according to various embodiments of the disclosed technology have been described in the text.

BRIEF DESCRIPTION OF THE DRAWINGS

FIG. 2 is a schematic layout diagram illustrating a representation of an example of a pixel array of an image sensor in accordance with an embodiment of the disclosed technology.

FIGS. 9A and 9B are representations of examples of longitudinal cross-sectional views to assist in the explanation of paths along which light travels depending on a refractive index of partition patterns.

FIGS. 11A and 11B to FIGS. 13A and 13B are schematic layout diagrams illustrating representations of examples of phase difference detection pixels of phase difference detection pixel blocks of image sensors in accordance with embodiments of the disclosed technology.

DETAILED DESCRIPTION

Figure 1:
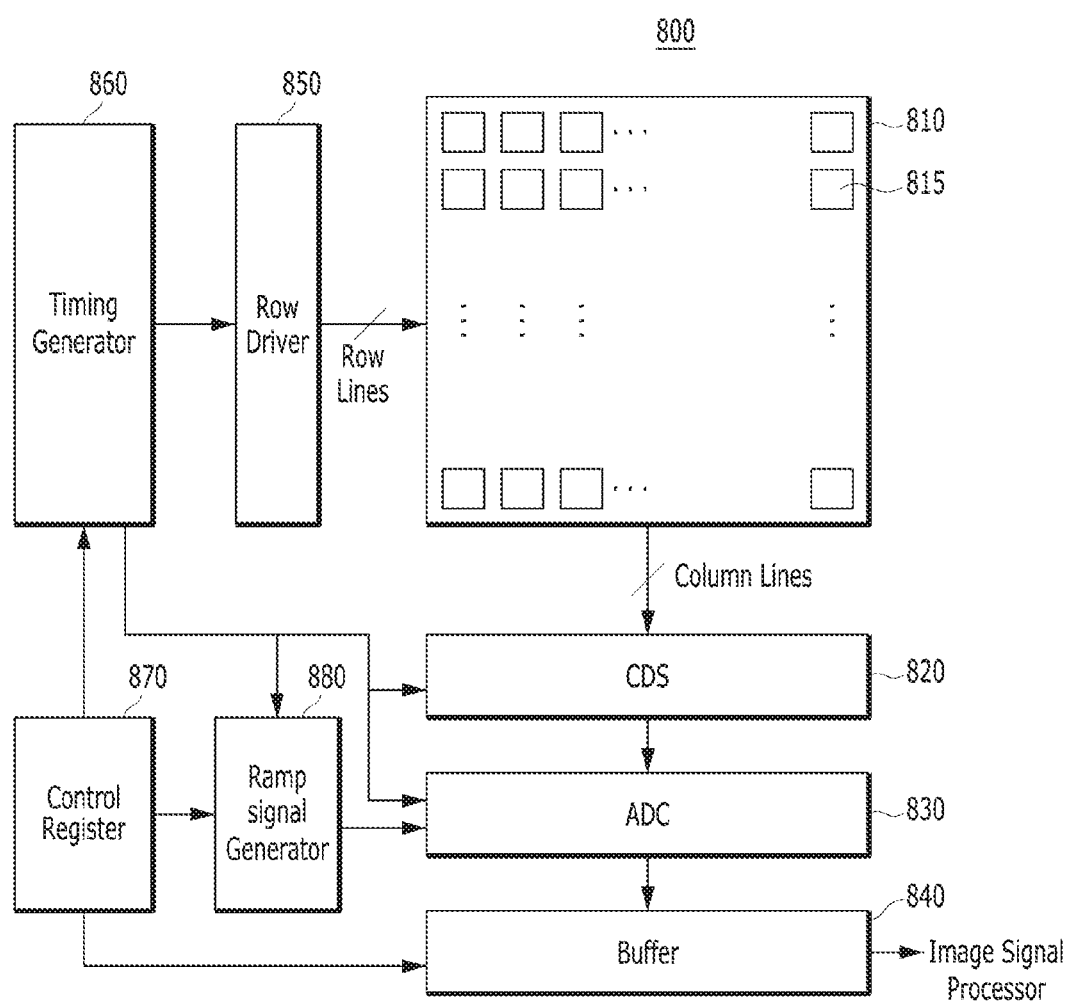
FIG. 1 is a block diagram schematically illustrating a representation of an example of an image sensor in accordance with an embodiment of the disclosed technology.

An image sensor array can be designed to include imaging pixels and phase difference detection pixels where the imaging pixels are designed and operated for capturing incident light to represent a subject or a scene as a color image, and the phase difference detection pixels are designed and operated for capturing incident light at different phase difference detection pixels to detect a phase of a captured image or scene. Such phase information can be used for improving the imaging quality or operation, including, e.g., implementing auto-focusing and representing a three-dimensional representation of the captured image or scene. In some implementations of phase difference detection pixels, two different phase detection pixels can be paired to obtain signals that can be processed to measure the distance difference or the phase of a detected image.

The disclosed technology can be implemented to provide an image sensor including phase difference detection pixels and structures disposed over the phase difference detection pixels to improve the light receiving efficiency of the phase difference detection pixels. In some implementations as illustrated in the examples below, the structures above the phase difference detection pixels may include a patterned optical transmitting layer with a refractive index lower than that of color filters disposed over image pixels and optically opaque guide patterns to control the optical receiving aperture of each photosensing area for the phase difference detection pixels.

In the disclosed technology, advantages, features and methods for achieving them will become more apparent after a reading of the following exemplary embodiments taken in conjunction with the drawings. The disclosed technology may be embodied in different forms and should not be construed as limited to the embodiments set forth herein. Throughout the disclosure, like reference numerals refer to like parts throughout the various figures and embodiments of the present invention.

In the specification, the "transmitting layer" may operate to transmit or pass light to a photosensing element. In some implementations, the "transmitting layer" may include at least one of color filters or transparent layers to transmit or pass visible lights.

FIG. 1 is a block diagram schematically illustrating a representation of an example of an image sensor 800 in accordance with an embodiment of the technical spirit of the disclosed technology. Referring to FIG. 1, the image sensor 800 in accordance with the embodiment of the technical spirit of the disclosed technology may include a pixel array 810 in which a plurality of pixels are arranged in a matrix structure, a correlated double sampler (CDS) 820, an analog-digital converter (ADC) 830, a buffer 840, a row driver 850, a timing generator 860, a control register 870, and a ramp signal generator 880.

The pixel array 810 may include a plurality of pixel blocks 815 which are arranged in a matrix structure including columns and rows of pixels. Each pixel may be implemented by a photo sensing device or circuit that produce an electrical signal in response to received light, including, e.g., a photo diode, a photo transistor, a photo gate, or other photosensitive circuitry capable of converting light into a pixel signal (e.g., a charge, a voltage or a current). Each of the plurality of pixel blocks 815 may convert an optical image information into an electrical image signal and transmit the electrical image signal to the CDS 820 through a corresponding column line. Each of the plurality of pixel blocks 815 may be coupled with one of row lines and one of column lines.

The CDS 820 may hold and sample the electrical image signals which are received from the pixels of pixel blocks 815 within the pixel array 810. For example, the CDS 820 may sample a reference voltage level and the voltage level of a received electrical image signal from one pixel block 815 according to a clock signal provided from the timing generator 860 and transmit an analog signal corresponding to the difference therebetween to the ADC 830.

The ADC 830 may convert the received analog signal into a digital signal representing the electrical image signal from a particular pixel block 815 and transmit the digital signal to the buffer 840.

The buffer 840 may latch or hold the received digital signal and output the latched or held digital signal to an image signal processor (not shown). The buffer 840 may include a memory for latching a digital signal and a sense amplifier for amplifying the digital signal.

The row driver 850 may drive the plurality of pixels of the pixel array 810 according to a signal of the timing generator 860. For example, the row driver 850 may generate select signals for selecting one of the plurality of row lines and/or driving signals for driving one of the plurality of row lines.

The timing generator 860 may generate a timing signal for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal outputted from the buffer 840, according to control of the timing generator 860.

FIG. 2 is a schematic layout diagram illustrating a representation of an example of a pixel array of an image sensor in accordance with an embodiment of the disclosed technology.

Referring to FIG. 2, the pixel array 810 of the image sensor 800 may include a plurality of unit image pixel blocks 100, a left phase difference detection pixel block 200L and a right phase difference detection pixel block 200R which are arranged in a matrix form including rows and columns. The image sensor 800 includes the phase difference detection pixels to perform autofocus (AF). Phase difference detection is achieved by adding phase difference detection pixels to the pixel array 810. The signals output from the phase difference detection pixels are used to detect phase differences between signals generated by different phase difference detection pixels and the detected phase differences can be used to perform AF.

Each of the unit image pixel blocks 100 may include image pixels R, G1, G2, and B which are arranged in a matrix form including columns and rows. An array of different color filters may be arranged on the pixels in the pixel array 810 such that the light of a specific color is input to each pixel. For example, each of the unit image pixel blocks 100 may include a red pixel R, first and second green pixels G1 and G2, and a blue pixel B in an implementation of a Bayer color filter. On top of the pixels, the color filters are placed to cover the pixels for photosensing to filter the incident light in different colors at different pixel locations to capture the color information in a sensed image. The red pixel R, the first and second green pixels G1 and G2, and the blue pixel B of each of the unit image pixel blocks 100 may receive lights of respective corresponding colors and generate photoelectrons.

The left phase difference detection pixel block 200L and the right phase difference detection pixel block 200R are located at different locations from the image pixel blocks 100. The left phase difference detection pixel block 200L may include a red pixel R, first and second green pixels G1 and G2, and a left phase difference detection pixel LP, and the right phase difference detection pixel block 200R may include a red pixel R, first and second green pixels G1 and G2, and a right phase difference detection pixel RP. Each of the left phase difference detection pixel LP and the right phase difference detection pixel RP may analyze an information on the phase difference of light depending on the incident angle of light and may activate an auto-focusing function.

While it is illustrated in the present embodiment that the left and right phase difference detection pixels LP and RP replace the blue pixels B of the unit image pixel blocks 100, other implementations are also possible. For example, it is to be noted that, in other embodiments, each of the left and right phase difference detection pixels LP and RP may replace one of the red pixel R, the first green pixel G1 and the second green pixel G2 other than the blue pixel B.

Figure 3A:
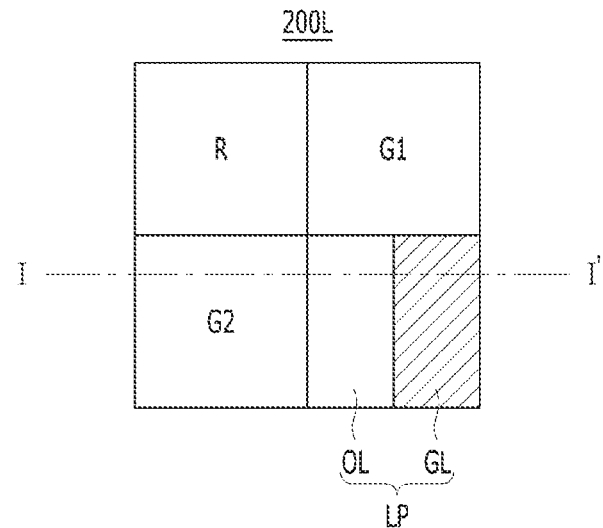
FIGS. 3A and 3B are schematic layout diagrams illustrating representations of examples of phase difference detection pixels of phase difference detection pixel blocks of an image sensor in accordance with an embodiment of the disclosed technology.
Figure 3B:
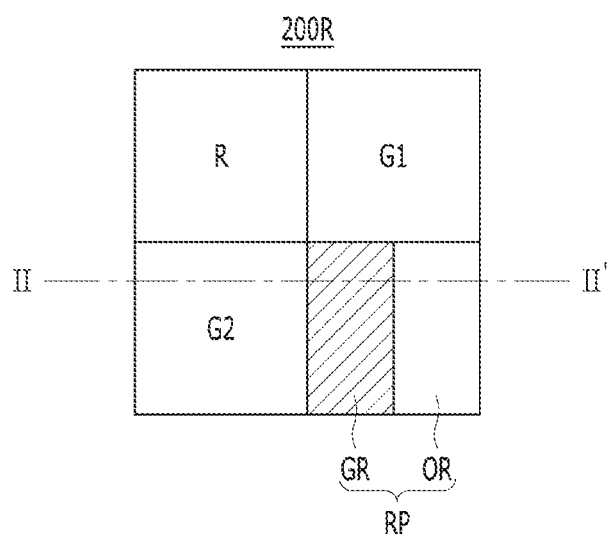

FIGS. 3A and 3B are schematic layout diagrams illustrating representations of examples of phase difference detection pixels LP and RP of phase difference detection pixel blocks 200L and 200R of an image sensor in accordance with an embodiment of the disclosed technology. Referring to FIGS. 3A and 3B, the left phase difference detection pixel block 200L of the image sensor 800 may include the left phase difference detection pixel LP and the right phase difference detection pixel block 200R may include the right phase difference detection pixel RP. The left phase difference detection pixel LP may include an opening OL which is positioned on a left side of the left phase difference detection pixel LP and a guide pattern GL which is positioned on a right side of the left phase difference detection pixel LP. The right phase difference detection pixel RP may include a guide pattern GR which is positioned on a left side of the right phase difference detection pixel RP and an opening OR which is positioned a right side of the right phase difference detection pixel RP. The locations of the openings OR and the guide patterns GL and GR can be modified. For example, in another embodiment of the disclosed technology, the right phase difference detection pixel RP may include an opening OR on the left side of the right phase difference detection pixel RP and a guide pattern GR on the right side of the right phase difference detection pixel RP, and the left phase difference detection pixel LP may include a guide pattern GL on the left side of the left phase difference detection pixel LP and an opening OL on the right side of the left phase difference detection pixel LP.

Figure 4A:
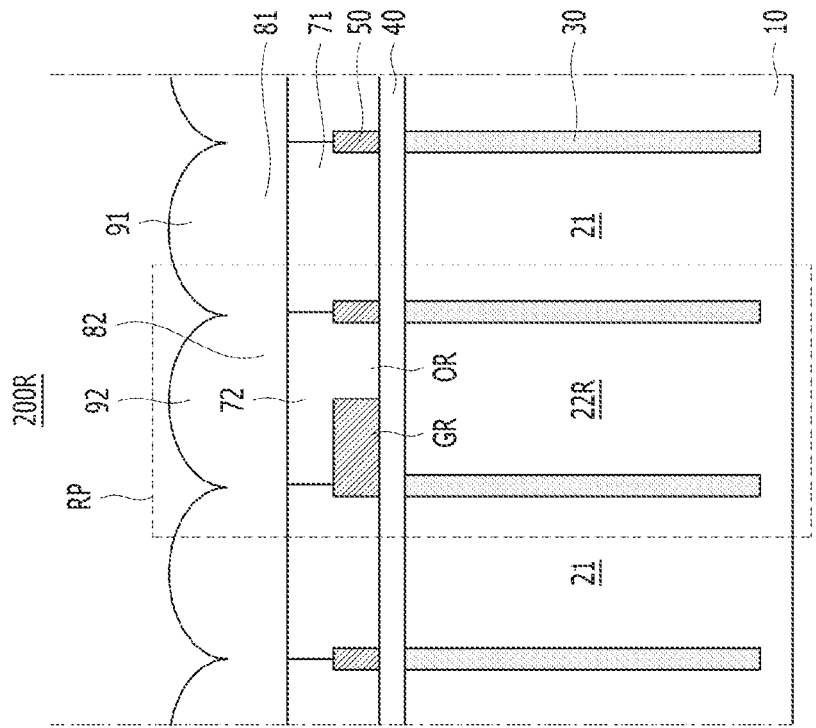
FIGS. 4A and 4B are longitudinal cross-sectional views of a left phase difference detection pixel block and a right phase difference detection pixel block, taken along the line I-I' of FIG. 3A and the line of FIG. 3B, respectively.
Figure 4B:
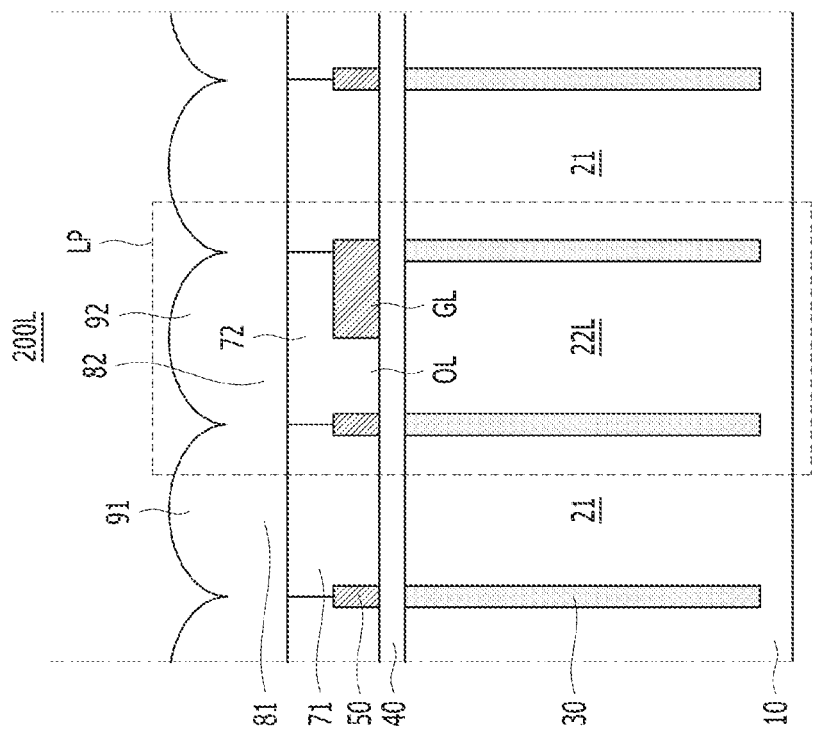

FIGS. 4A and 4B are longitudinal cross-sectional views of a left phase difference detection pixel block 200L and a right phase difference detection pixel block 200R in accordance with an embodiment of the disclosed technology, taken along the line I-I' of FIG. 3A and the line of FIG. 33, respectively. Referring to FIGS. 4A and 4B, the left phase difference detection pixel block 200L and the right phase difference detection pixel block 200R may include photodiodes 21, 22L, and 22R and isolation patterns 30 in a substrate 10, and an antireflection layer 40, grid patterns 50, left and right guide patterns GL and GR, color filters 71, transmitting layers 72, overcoat layers 81 and 82, and micro lenses 91 and 92 on the substrate 10.

The substrate 10 may include a single crystal silicon layer, and the photodiodes 21, 22L, and 22R may be or include N-doping regions which include N-type ions doped in the substrate 10. The photodiodes 21, 22L, and 22R may include image photodiodes 21 and left and right phase difference detection photodiodes 22L and 22R. The image photodiodes 21 may receive lights transmitted through the color filters 71 and generate photoelectrons which have image information. The left and right phase difference detection photodiodes 22L and 22R may generate photoelectrons which have information on the incident angles of lights transmitted through the transmitting layers 72. The amounts of photoelectrons generated in the left and right phase difference detection photodiodes 22L and 22R may vary depending on the incident angles of lights transmitted through the transmitting layers 72.

The isolation patterns 30 may include a dielectric material which is filled in the trenches formed in the substrate 10. The isolation patterns 30 may have a partition form to optically isolate the photodiodes 21, 22L, and 22R.

The antireflection layer 40 may include dielectric layers which are stacked in a single layer or a multi-layer. In some implementations, the antireflection layer 40 may include one or more planar dielectric layers. For example, the antireflection layer 40 may include a silicon nitride, a silicon oxide, a silicon oxynitride, a silicon oxide or silicon nitride including carbon, or a combination thereof.

The grid patterns 50 may be arranged in the form of a mesh when viewed from the top. A grid pattern 50 may be disposed between the lower portions of one of the color filters 71 and one of the transmitting layers 72 and separate the lower portion of the color filter 71 from the lower portion of the transmitting layer 72. For example, the lower portions of the color filters 71 and the transmitting layers 72 may be filled in spaces which are formed by the grid patterns 50. The grid patterns 50 may be vertically aligned with the isolation patterns 30. The grid patterns 50 may include a metal such as tungsten (W).

The left and right guide patterns GL and GR may be formed between the antireflection layer 40 and the transmitting layers 72. The left and right guide patterns GL and GR may be disposed over the left and right phase difference detection photodiodes 22L and 22R to block or blind some portions, for example, about halves, of the left and right phase difference detection photodiodes 22L and 22R, respectively. The left and right guide patterns GL and GR may include the same material as the grid patterns 50. In some implementations, the left and right guide patterns GL and GR may be integrally formed with the grid patterns 50. For example, the left and right guide patterns GL and GR may be formed as portions of the grid patterns 50. The left and right phase difference detection pixels LP and RP, which are disposed to cover at least portions of the left and right guide patterns GL and GR, may include blind regions which are blinded or blocked by the left and right guide patterns GL and GR, respectively. Further, the left and right phase difference detection pixels LP and RP may include left and right openings OL and OR which are not blinded or blocked by the left and right guide patterns GL and GR.

The color filters 71 may have lower portions formed between the grid patterns 50 such that the lower portion vertically overlaps and is aligned with the image photodiodes 21. The grid patterns 50 may physically and optically separate the lower portions of the color filters 71 from one another. For example, the lower portions of the color filters 71 may be brought into contact with the side surfaces of the grid patterns 50. The color filters 71 may have upper portions formed over the lower portions of the color filters 71. Since the grid patterns 50 are not formed between the upper portions the color filters, the upper portions of the color filters 71 may be brought into contact with one another. Portions of the upper portions of the color filters 71 may be formed on portions of the top surfaces of the grid patterns 50. Each of the color filters 71 may include a polymeric organic material containing one of a red pigment, a green pigment or a blue pigment.

The transmitting layers 72 may have lower portions formed between one of the left and right guide patterns GL and GR and one of the grid patterns 50. The transmitting layers 72 may have upper portions formed over the lower portions of the transmitting layers 72. The upper portions of the transmitting layers 72 may vertically overlap with the left phase difference detection photodiodes 22L or the right phase difference detection photodiodes 22R. The lower portions of the transmitting layers 72 may be brought into contact with the side surfaces of the grid patterns 50 and the left guide patterns GL or the right guide patterns GL and GR. The upper portions of the transmitting layers 72 may be formed on the tops of the grid patterns 50 and the left and right guide patterns GL and GR. The transmitting layers 72 may vertically overlap with the left phase difference detection photodiodes 22L or and right phase difference detection photodiodes 22R.

The transmitting layers 72 may include a thermosetting material which does not contain the pigments. For example, the transmitting layers 72 may include a polymeric material such as a polystyrene-based resin, a polyimide-based resin, a polysiloxane-based resin, an acrylic-based resin, an epoxy-based resin, or a copolymer resin thereof, or a silicon oxide-based or silicon nitride-based inorganic material. The transmitting layers 72 may have a refractive index lower than the color filters 71. Also, the transmitting layers 72 may have a refractive index lower than the overcoat layers 81 and 82 and the micro lenses 91 and 92.

The overcoat layers 81 and 82 may include image overcoat layers 81 which are disposed over and vertically overlap with the image photodiodes 21 and the color filters 71 and phase difference detection overcoat layers 82 which are disposed over and vertically overlap with the phase difference detection photodiodes 22L and 22R and the transmitting layers 72. The overcoat layers 81 and 82 may include a polymeric organic material such as a polyimide-based resin, a polystyrene-based resin, an acrylic-based resin, an epoxy-based resin or a combination thereof, or an inorganic material such as a silicon oxide.

The color filters 71 may have different thicknesses depending on a color to filter through the color filters 71. The overcoat layers 81 and 82 may compensate for the different thicknesses of the color filters 71 and the transmitting layers 72 such that top surfaces of the overcoat layers 81 and 82 are coplanar.

The micro lenses 91 and 92 may include image micro lenses 91 which are disposed over and vertically overlap with the image photodiodes 21, the color filters 71 and the image overcoat layers 81 and phase difference detection micro lenses 92 which are disposed over and vertically overlap with the phase difference detection photodiodes 22L and 22R, the transmitting layers 72 and the phase difference detection overcoat layers 82. The micro lenses 91 and 92 may have hemispherical surfaces. The micro lenses 91 and 92 may include a polymeric organic material such as a polyimide-based resin, a polystyrene-based resin, an acrylic-based resin, an epoxy-based resin or a combination thereof, or an inorganic material such as a silicon oxide. For example, the micro lenses 91 and 92 may include the same material as the overcoat layers 81 and 82.

Figure 5A:
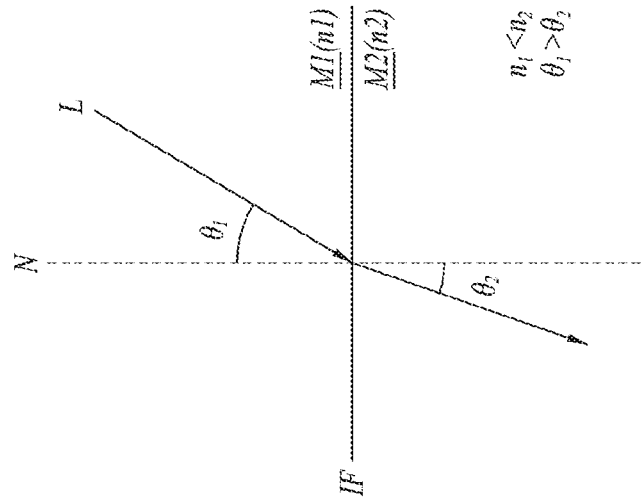
FIGS. 5A and 5B are representations of examples of diagrams to assist in the explanation of a concept of the disclosed technology based on the Snell's Law.
Figure 5B:
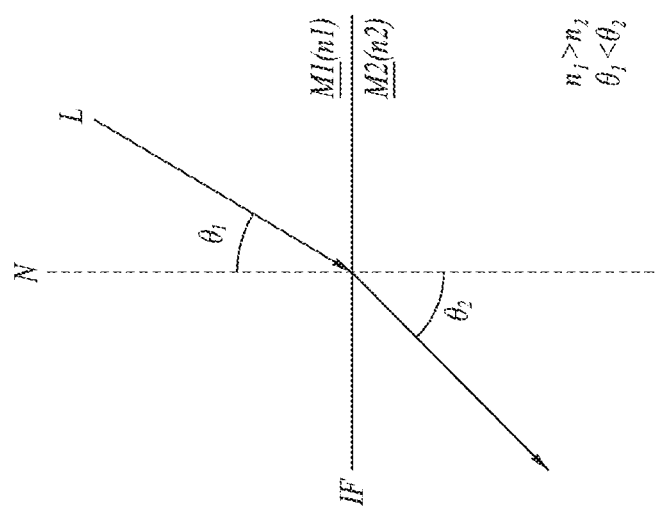

FIGS. 5A and 5B are representations of examples of diagrams to assist in the explanation of the technical concept of the disclosed technology based on the Snell's Law. Referring to FIGS. 5A and 5B, when permeability of a first medium M1 and a second medium M2 is the same, at an interface IF between a first medium M1 having a first refractive index $n_1$ and a second medium M2 having a second refractive index $n_2$, a light which is incident at a first angle $\Theta_1$ may exit at a second angle $\Theta_2$. Namely, the following equation is established.

$$\frac{\sin\Theta_1}{\sin\Theta_2} = \frac{n_2}{n_1}$$

FIG. 5A shows a traveling path of light L in the case where the first refractive index $n_1$ is greater than the second refractive index $n_2$, and FIG. 5B shows a traveling path of light L in the case where the first refractive index $n_1$ is smaller than the second refractive index $n_2$.

Based on FIGS. 5A and 5B, "$\Theta_1<\Theta_2$" may be established when "$n_1>n_2$," and "$\Theta_1>\Theta_2$" may be established when "$n_1<n_2$."

Figure 6A:
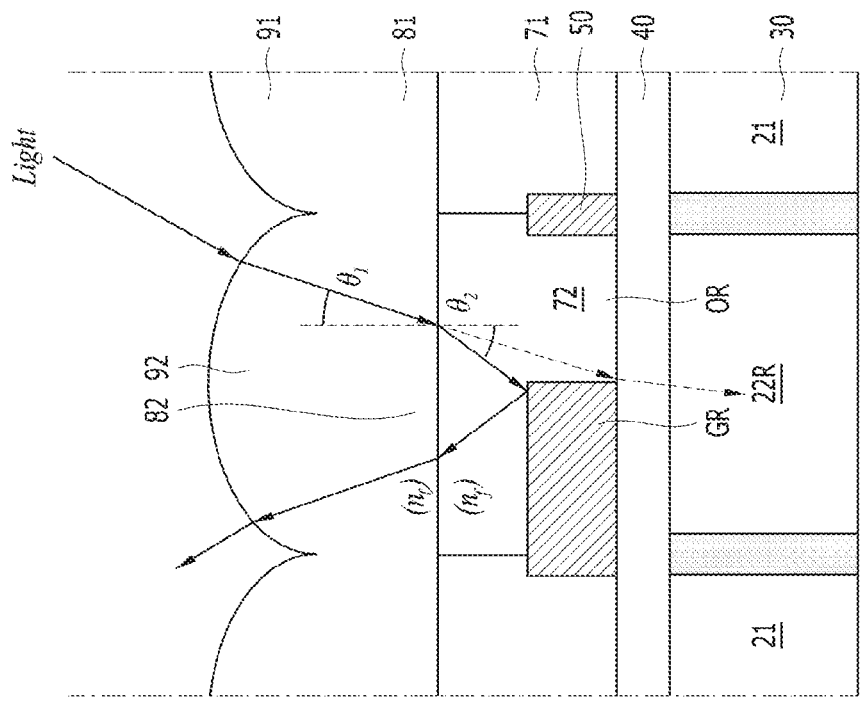
FIGS. 6A and 6B are longitudinal cross-sectional views schematically illustrating that paths along which light travels vary depending on an incident angle in a left phase difference detection pixel and a right phase difference detection pixel.
Figure 6B:
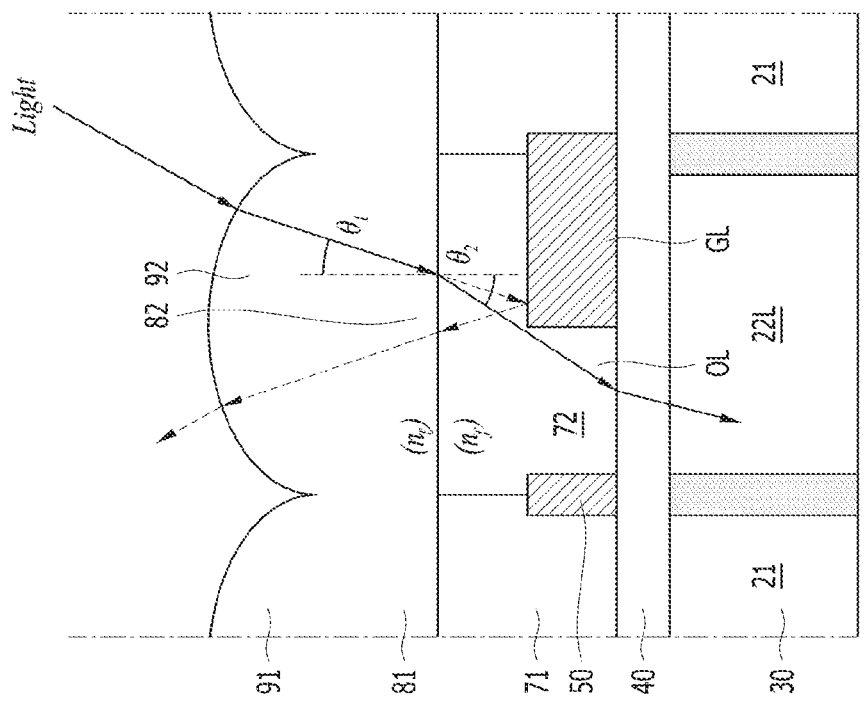

FIGS. 6A and 6B are longitudinal cross-sectional views schematically illustrating that paths along which light travels vary depending on an incident angle in a left phase difference detection pixel LP and a right phase difference detection pixel RP. Referring to FIGS. 6A and 6B, in the case where a refractive index $n_f$ of the transmitting layers 72 is smaller than a refractive index $n_l$ of the phase difference detection micro lenses 92 or the phase difference detection overcoat layers 82, lights may travel along the solid arrows.

Referring to FIG. 6A, in the case where the refractive index $n_f$ of the transmitting layers 72 is equal to or greater than the refractive index $n_l$ of the phase difference detection micro lenses 92 or the phase difference detection overcoat layers 82, a light which is incident at a first angle $\Theta_1$ may not be received in the left phase difference detection photodiode 22L by the presence of the left guide pattern GL (see the dotted arrow). However, in the case where the refractive index $n_f$ of the transmitting layers 72 is smaller than the refractive index $n_l$ of the phase difference detection micro lenses 92 or the phase difference detection overcoat layers 82, the light which is incident at the first angle $\Theta_1$ may be diffracted at the interface between the phase difference detection overcoat layer 82 and the transmitting layer 72 and avoid the left guide pattern GL, and therefore, the diffracted light may be received in the left phase difference detection photodiode 22L through the left opening OL (see the solid arrow).

Referring to FIG. 6B, in the case where the refractive index $n_f$ of the transmitting layers 72 is equal to or greater than the refractive index $n_l$ of the phase difference detection micro lenses 92 or the phase difference detection overcoat layers 82, a light which is incident at the first angle $\Theta_1$ may be received in the right phase difference detection photodiode 22R through the right opening OR (see the dotted arrow). However, in the case where the refractive index $n_f$ of the transmitting layers 72 is smaller than the refractive index $n_l$ of the phase difference detection micro lenses 92 or the phase difference detection overcoat layers 82, the light which is incident at the first angle $\Theta_1$ may be diffracted at the interface between the phase difference detection overcoat layer 82 and the transmitting layer 72 and may not be received in the right phase difference detection photodiode 22R by the presence of the right guide pattern GR (see the solid arrow).

Referring to FIGS. 6A and 6B, when the light is incident at the positive first angle $\Theta_1$ and the refractive index $n_f$ the transmitting layers 72 is smaller than the refractive index $n_l$ of the phase difference detection micro lenses 92 or the phase difference detection overcoat layers 82, the light receiving efficiency of the left phase difference detection photodiode 22L may be higher than the light receiving efficiency of the right phase difference detection photodiode 22R.

In the case where a light is incident at a negative angle, by the same principle, the light receiving efficiency of the right phase difference detection photodiode 22R may be higher than the light receiving efficiency of the left phase difference detection photodiode 22L.

Figure 7:
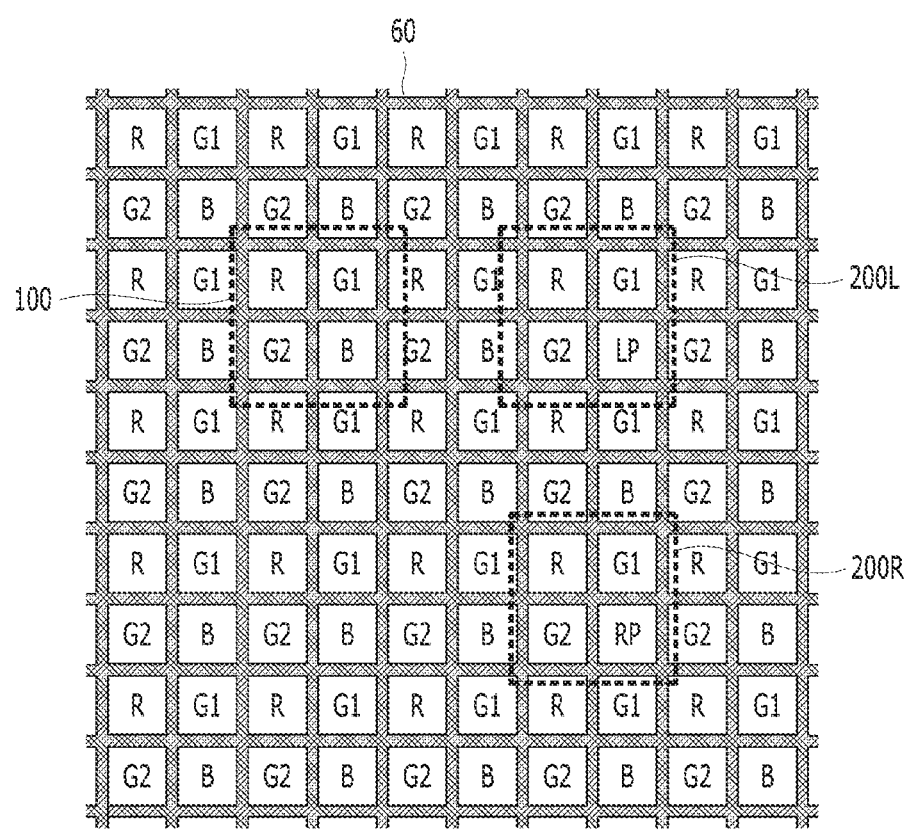
FIG. 7 is a schematic layout diagram illustrating a representation of an example of a pixel array of an image sensor in accordance with an embodiment of the disclosed technology.

FIG. 7 is a schematic layout diagram illustrating a representation of an example of a pixel array 810 of an image sensor 800 in accordance with an embodiment of the disclosed technology. Referring to FIG. 7, the pixel array 810 of the image sensor 800 in accordance with the embodiment of the disclosed technology may include a plurality of unit image pixel blocks 100, a left phase difference detection pixel block 200L and a right phase difference detection pixel block 200R which are arranged in a matrix form including rows and columns, and partition patterns 60. As described above, each of the unit image pixel blocks 100 may include a red pixel R, first and second green pixels G1 and G2 and a blue pixel B, the left phase difference detection pixel block 200L may include a red pixel R, first and second green pixels G1 and G2 and a left phase difference detection pixel LP, and the right phase difference detection pixel block 200R may include a red pixel R, first and second green pixels G1 and G2 and a right phase difference detection pixel RP. The partition patterns 60 may be arranged in the form of a mesh which separates the respective pixels R, G1, G2, B, LP and RP of the unit image pixel blocks 100 and the phase difference detection pixel blocks 200L and 200R.

Figure 8A:
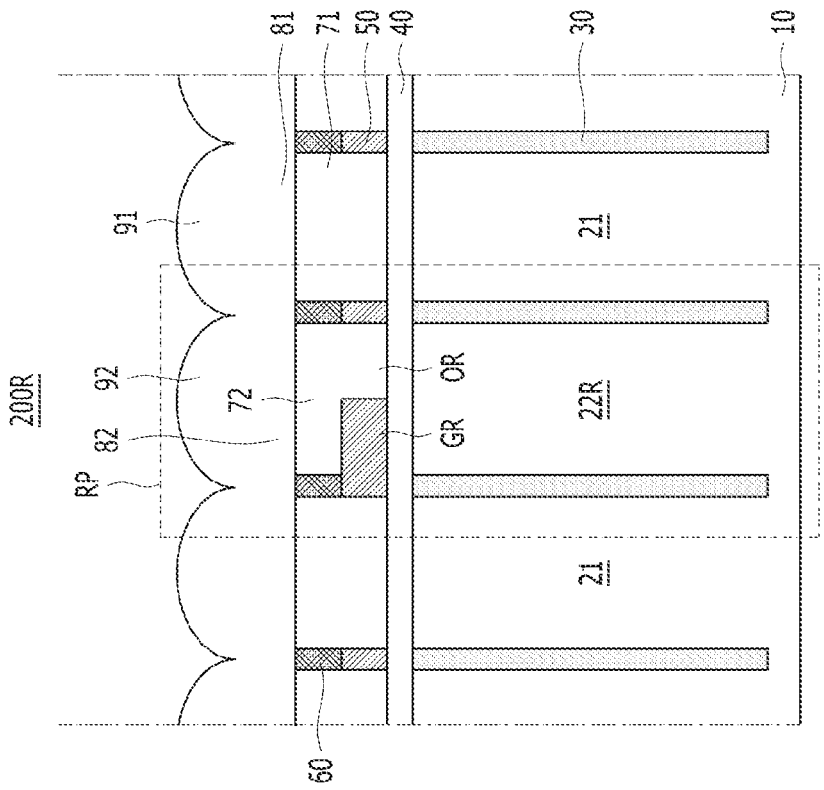
FIGS. 8A and 8B are schematic longitudinal cross-sectional views of a left phase difference detection pixel block and a right phase difference detection pixel block of an image sensor in accordance with an embodiment of the disclosed technology.
Figure 8B:
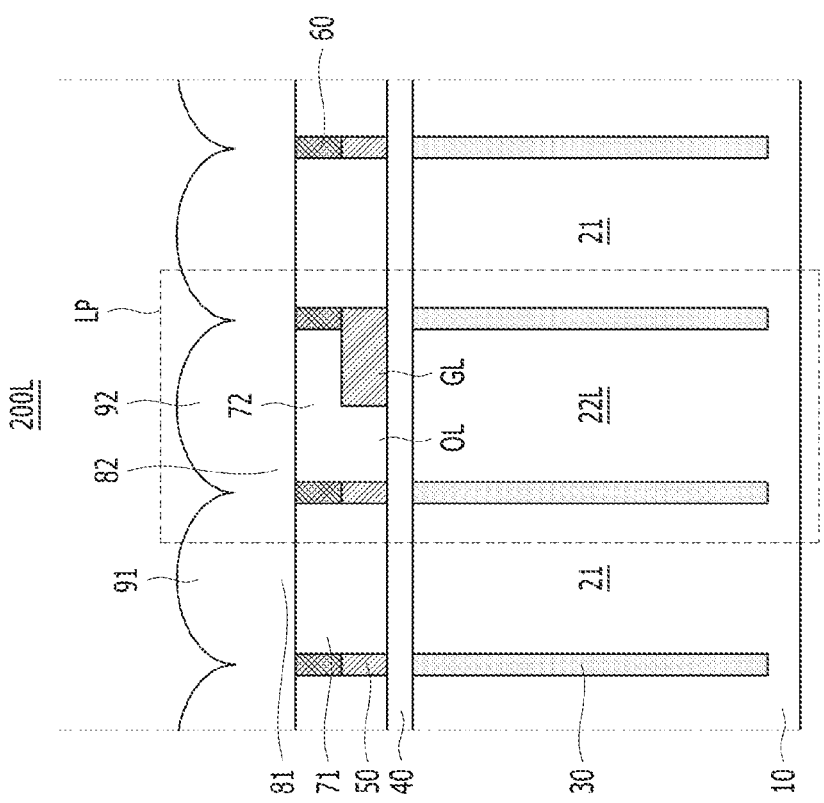

FIGS. 8A and 8B are schematic longitudinal cross-sectional views of the left phase difference detection pixel block 200L and the right phase difference detection pixel block 200R of the image sensor 800. Referring to FIGS. 8A and 8B, the left phase difference detection pixel block 200L and the right phase difference detection pixel block 200R of the image sensor 800 in accordance with an embodiment of the disclosed technology may include photodiodes 21, 22L and 22R and isolation patterns 30 in a substrate 10, and an antireflection layer 40, grid patterns 50, guide patterns GL and GR, partition patterns 60, color filters 71, transmitting layers 72, overcoat layers 81 and 82, and micro lenses 91 and 92 on the substrate 10. The partition patterns 60 may be formed on the grid patterns 50 in such a way as to vertically overlap with the grid patterns 50 and the isolation patterns 30.

The grid patterns 50 and the partition patterns 60 may be arranged in the form of a mesh when viewed from the top. The color filters 71 and the transmitting layers 72 may be filled in spaces which are formed by the grid patterns 50 and the partition patterns 60. The grid patterns 50 may physically and optically separate the lower portions of the color filters 71 and the transmitting layers 72 from one another, and the partition patterns 60 may physically and optically separate the upper portions of the color filters 71 and the transmitting layers 72 from one another. For example, the lower portions of the color filters 71 and the transmitting layers 72 may be brought into contact with the grid patterns 50, and the upper portions of the color filters 71 and the transmitting layers 72 may be brought into contact with the partition patterns 60. The grid patterns 50 may include an opaque material, for example, a metal such as tungsten (W).

The partition patterns 60 may have a refractive index lower than the color filters 71. In an embodiment of the disclosed technology, the partition patterns 60 may have the same refractive index as the transmitting layers 72. In another embodiment, the partition patterns 60 may have a refractive index higher than the transmitting layers 72. In still another embodiment, the partition patterns 60 may have a refractive index equal to or lower than the overcoat layers 81 and 82 and/or the micro lenses 91 and 92. The partition patterns 60 may include a thermosetting material. For example, the partition patterns 60 may include a polymeric material such as a polystyrene-based resin, a polyimide-based resin, a polysiloxane-based resin, an acrylic-based resin, an epoxy-based resin or a copolymer resin thereof, or a silicon oxide-based or silicon nitride-based inorganic material. Components which are not described herein may be understood when referring to FIGS. 4A and 4B.

FIGS. 9A and 9B are representations of examples of longitudinal cross-sectional views to assist in the explanation of paths along which lights travel depending on a refractive index of the partition patterns 60. Referring to FIGS. 9A and 9B, in the case where a refractive index $n_p$ of the partition patterns 60 is lower than the refractive index $n_f$ of the transmitting layers 72, lights may travel as indicated by the arrows. In detail, the lights which are transmitted through the transmitting layers 72 and are incident on the interfaces between the transmitting layers 72 and the partition patterns 60 may be totally reflected at the interfaces. Therefore, since light loss is reduced, the light receiving efficiencies of the phase difference detection photodiodes 22L and 22R can be improved.

Figure 10:
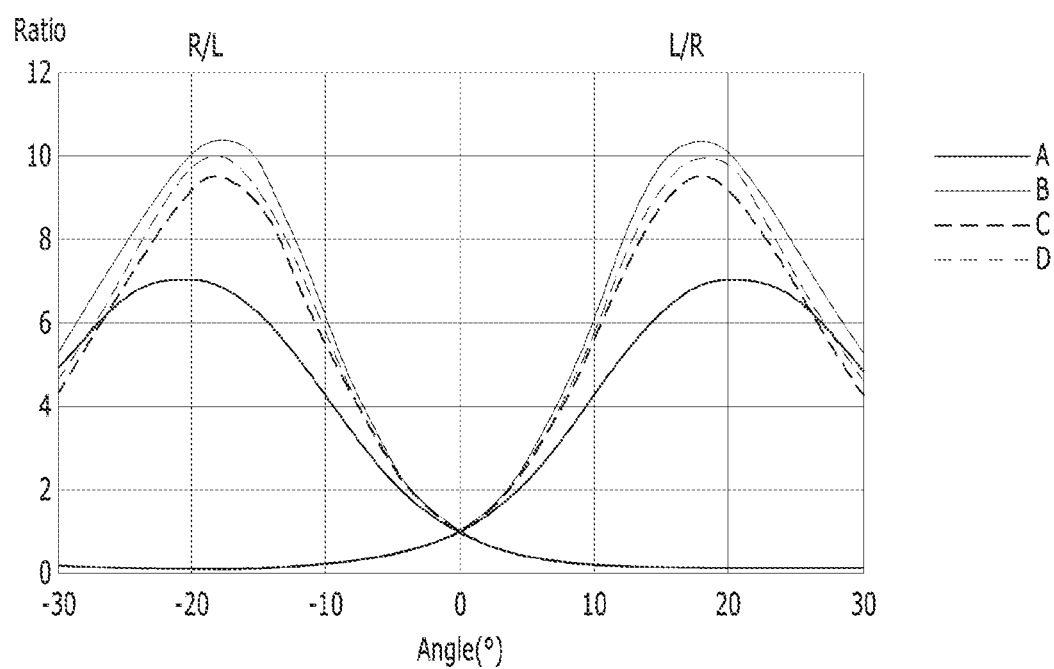
FIG. 10 is a representation of an example of a graph experimentally showing energy ratios according to incident angles of light received in left phase difference detection photodiodes and right phase difference detection photodiodes of the image sensors in accordance with the various embodiments of the disclosed technology.

FIG. 10 is a representation of an example of a graph experimentally showing energy ratios according to incident angles of lights received in a left phase difference detection photodiodes 22L and a right phase difference detection photodiodes 22R of an image sensors 800. The X-axis represents the incident angle of light, and the Y-axis represents the energy ratio R/L or UR of the light received in the left phase difference detection photodiode 22L and the light received in the right phase difference detection photodiode 22R. Specifically, the left part of the graph represents the energy ratio of the light received in the right phase difference detection photodiode 22R with respect to the light received in the left phase difference detection photodiode 22L in the case where lights are incident on the left phase difference detection photodiode 22L and the right phase difference detection photodiode 22R at a negative angle, and the right part of the graph represents the energy ratio L/R of the light received in the left phase difference detection photodiode 22L with respect to the light received in the right phase difference detection photodiode 22R in the case where lights are incident on the left phase difference detection photodiode 22L and the right phase difference detection photodiode 22R at a positive angle.

For example, the line A shows the ratios R/L and L/R of the light energies received in the left phase difference detection photodiode 22L and the right phase difference detection photodiode 22R in a conventional image sensor, the line B shows the ratios R/L and L/R of the light energies received in the left phase difference detection photodiode 22L and the right phase difference detection photodiode 22R in the image sensor 800 in accordance with the embodiment of the disclosed technology shown in FIGS. 4A and 4B, and the lines C and D show the ratios R/L and L/R of the light energies received in the left phase difference detection photodiode 22L and the right phase difference detection photodiode 22R in the image sensor 800 in accordance with the embodiment of the disclosed technology shown in FIGS. 8A and 8B. The line C shows the ratios R/L and L/R in the case where the refractive index $n_p$ of the partition patterns 60 is the same as the refractive index $n_f$ of the transmitting layers 72, and the line D shows the ratios R/L and L/R in the case where the refractive index $n_p$ of the partition patterns 60 is smaller than the refractive index $n_f$ of the color filters 71 and is greater than the refractive index $n_f$ of the transmitting layers 72.

Referring to FIG. 10, in the image sensors 800 in accordance with the embodiments of the disclosed technology, the energy ratios R/L and L/R of the lights received in the left phase difference detection photodiode 22L and the right phase difference detection photodiode 22R vary depending on the incident angle of light. As compared to the energy ratios R/L and L/R in the conventional image sensor, the image sensor 800 of the disclosed technology have the greater energy ratios R/L and L/R in most of the incident ranges. Since the energy ratios R/L and L/R of the lights are important factors associated with the auto-focusing function of the image sensor 800 including quick adjustment of a balance, in the case where the energy ratios R/L and L/R of the lights are great, it is possible to quickly and precisely calculate the position and angle of a subject. Thus, by quickly and precisely sensing the angle and distance between the subject and a camera system, that is, between the subject and the image sensor 800, it is possible to analyze a focus position and state. Thus, in the image sensors 800 in accordance with the embodiments of the disclosed technology and a camera system including the image sensors 800, an automatic focus sensing and adjustment function can be quickly and precisely performed, and the photographing function of the camera system can be improved.

FIGS. 11A and 11B to FIGS. 13A and 13B are schematic layout diagrams illustrating representations of examples of phase difference detection pixels LP and RP of phase difference detection pixel blocks 200L and 200R of an image sensor 800 based on an implementation of the disclosed technology.

Figure 11A:
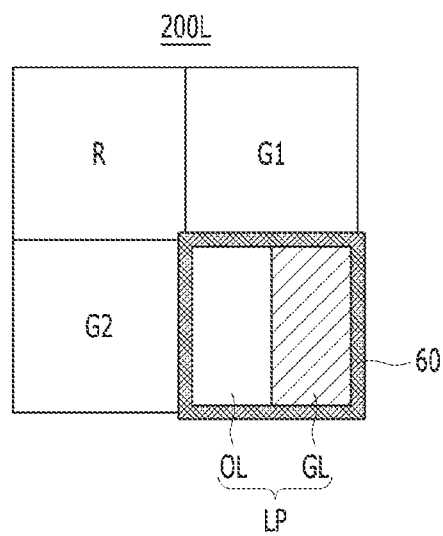
Figure 11B:
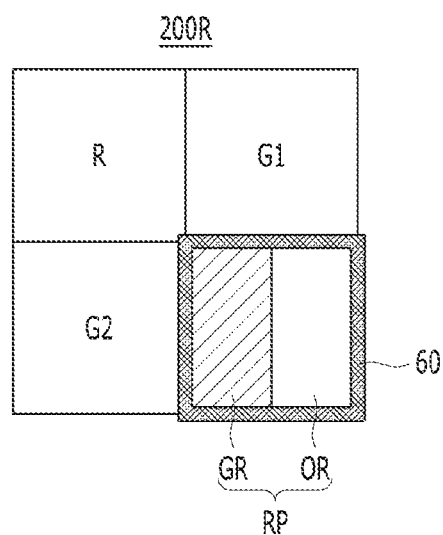

Referring to FIGS. 11A and 11B, a left phase difference detection pixel block 200L may include a partition pattern 60 which surrounds a left phase difference detection pixel LP, and a right phase difference detection pixel block 200R may include a partition pattern 60 which surrounds a right phase difference detection pixel RP. In this case, red pixels R and first and second green pixels G1 and G2 may not be surrounded by the partition patterns.

Figure 12A:
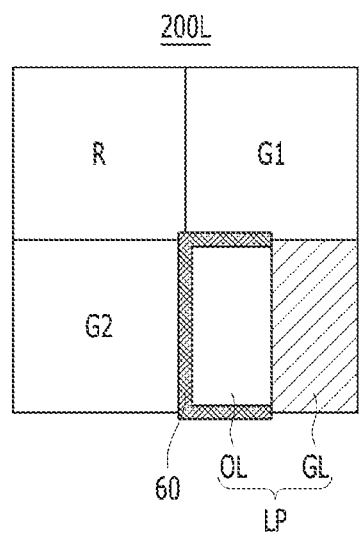
Figure 12B:
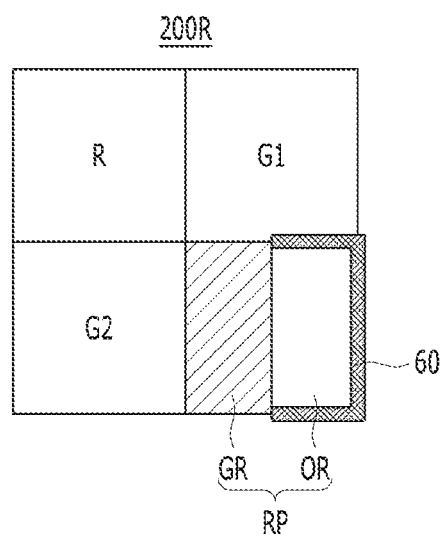

Referring to FIGS. 12A and 12B, a left phase difference detection pixel block 200L may include a partition pattern 60 which partially surrounds a left phase difference detection pixel LP, and a right phase difference detection pixel block 200R may include a partition pattern 60 which partially surrounds a right phase difference detection pixel RP. Red pixels R and first and second green pixels G1 and G2 may not be surrounded by the partition patterns 60. Specifically, the partition patterns 60 may be formed in the left phase difference detection pixel block 200L and the right phase difference detection pixel block 200R to surround the boundaries between the opening OL or OR and the pixels adjacent to the opening OL or OR, when the red pixels R and the first and second green pixels G1 and G2 are adjacent to the opening OL or OR. The partition patterns 60 may not be formed between the guide pattern GL or GR and the pixels adjacent to the guide pattern GL or GR, when the red pixels R and the first and second green pixels G1 and G2 are adjacent to the guide pattern GL or GR.

Figure 13A:
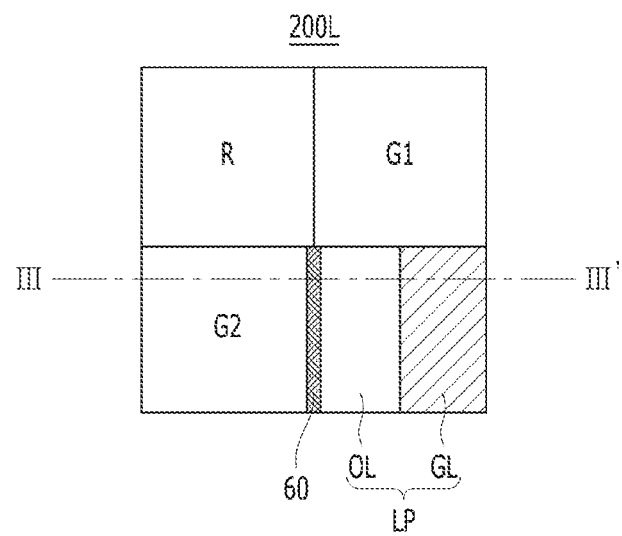
Figure 13B:
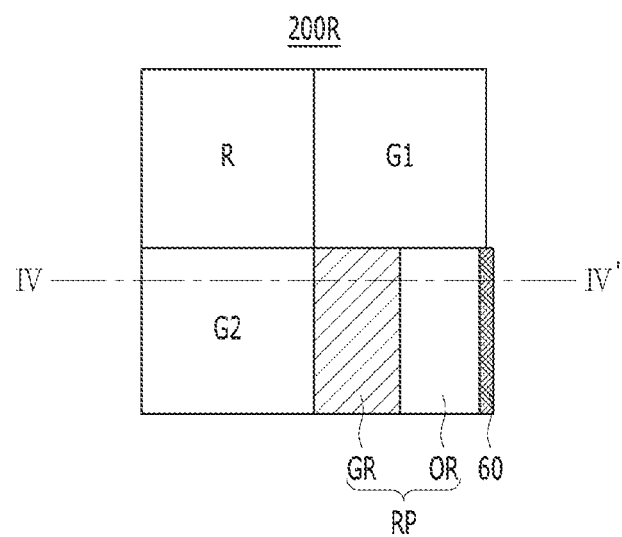

Referring to FIGS. 13A and 13B, a left phase difference detection pixel block 200L may include a partition pattern 60 which is disposed at one side of a left phase difference detection pixel LP, and a right phase difference detection pixel block 200R may include a partition pattern 60 which is disposed at one side of a right phase difference detection pixel RP. For example, the partition patterns 60 may be disposed only at the left side of the left phase difference detection pixel LP and the right side of the right phase difference detection pixel RP.

Figure 14A:
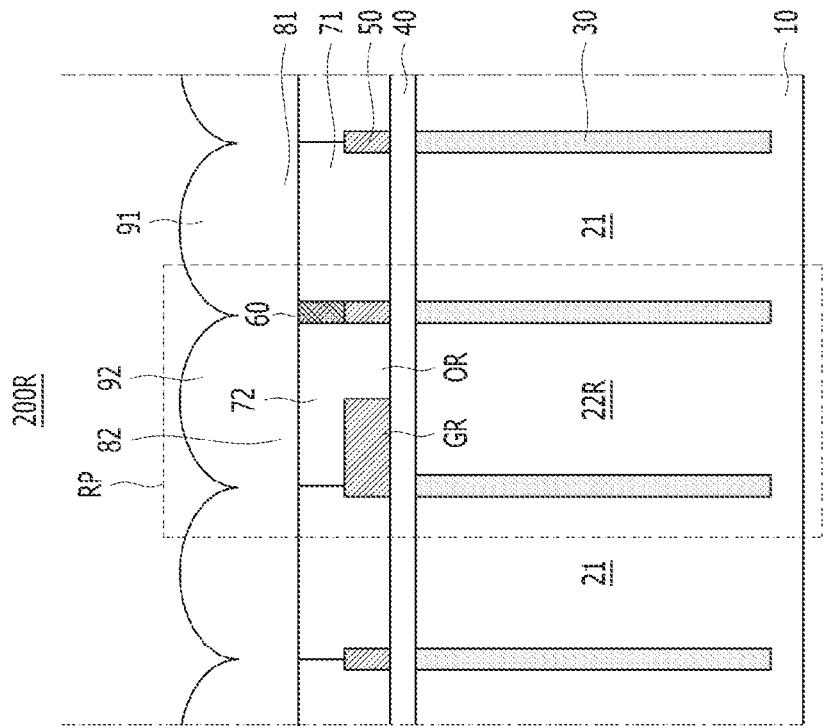
FIGS. 14A and 14B are longitudinal cross-sectional views of a left phase difference detection pixel block and a right phase difference detection pixel block in accordance with an embodiment of the disclosed technology, taken along the line of FIG. 13A and the line IV-IV' of FIG. 13B, respectively.
Figure 14B:
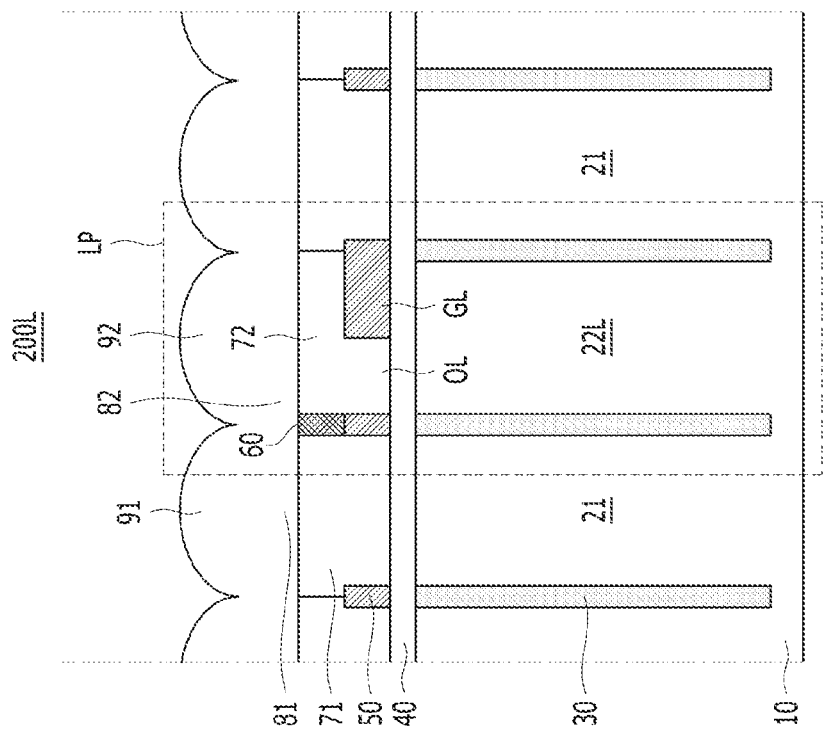

FIGS. 14A and 14B are longitudinal cross-sectional views of the left phase difference detection pixel block 200L and the right phase difference detection pixel block 200R, taken along the line III-III' of FIG. 13A and the line IV-IV' of FIG. 13B, respectively. Referring to FIGS. 14A and 14B, when compared to the left phase difference detection pixel block 200L and the right phase difference detection pixel block 200R shown in FIGS. 8A and 8B, the partition patterns 60 may be formed only on grid patterns 50 which are adjacent to openings OL and OR of the phase difference detection pixels LP and RP. In detail, the partition patterns 60 may be disposed only on the grid patterns 50 which are positioned at the left side of the left phase difference detection pixel LP and the right side of the right phase difference detection pixel RP.

When referring to FIGS. 11A and 11B, the partition patterns 60 may surround the peripheries of transmitting layers 72. For example, the partition patterns 60 may be formed only at the interfaces between color filters 71 and the transmitting layers 72.

When referring to FIGS. 12A and 12B, the partition patterns 60 may cover the several sides of transmitting layers 72 which are adjacent to the openings OL and OR. For example, the partition patterns 60 may cover the left side, a portion of the top surface and a portion of the bottom surface of the transmitting layer 72 of the left phase difference detection pixel LP and the right side, a portion of the top surface and a portion of the bottom surface of the transmitting layer 72 of the right phase difference detection pixel RP.

When referring to FIGS. 13A and 13B, the partition patterns 60 may cover one sides of transmitting layers 72 which are adjacent to openings OL and OR. For example, the partition patterns 60 may cover the left side of the transmitting layer 72 of the left phase difference detection pixel LP and the right side of the transmitting layer 72 of the right phase difference detection pixel RP.

Figure 15:
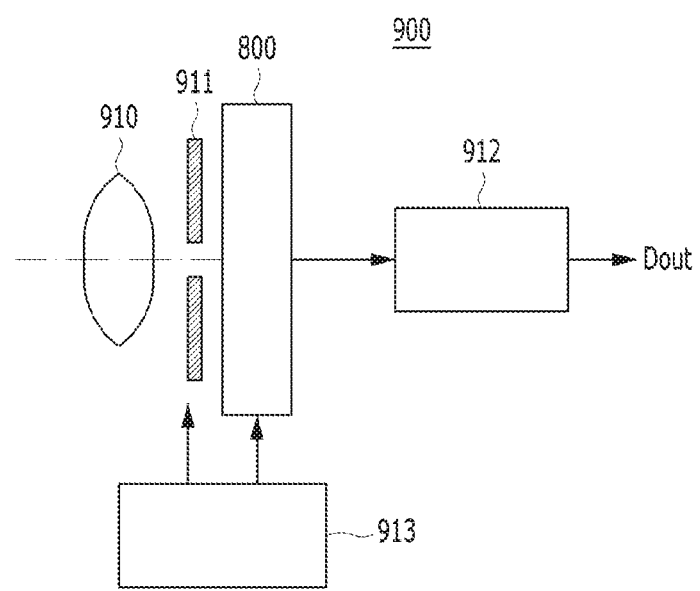
FIG. 15 is a diagram schematically illustrating a representation of an example of an electronic device including an image sensor in accordance with an embodiment of the disclosed technology.

FIG. 15 is a diagram schematically illustrating a representation of an example of an electronic device 900 including an image sensor 800 in accordance with an embodiment of the disclosed technology. Referring to FIG. 15, the electronic device 900 including at least one of the image sensors 800 according to the embodiments may include a camera capable of photographing a still image or a moving image. The electronic device 900 may include an optical system (or an optical lens) 910, a shutter unit 911, a driving circuit 913 which controls/drives the image sensor 800 and the shutter unit 911, and a signal processing circuit 912. The image sensor 800 may be the image sensors according to the various embodiments of the disclosed technology.

The optical system 910 may guide image light (incident light) from an object, to a pixel array (see the reference numeral 810 of FIG. 1) of the image sensor 800. The optical system 910 may include a plurality of optical lenses. The shutter unit 911 may control a light irradiation period and a light shielding period with respect to the image sensor 800. The driving circuit 913 may control the transmission operation of the image sensor 800 and the shutter operation of the shutter unit 911. The signal processing unit 912 performs various kinds of signal processing for the signal outputted from the image sensor 800. An image signal Dout after signal processing may be stored in a storage medium such as a memory or may be outputted to a monitor or the like.

Although various embodiments have been described for illustrative purposes, it will be apparent to those skilled in the art that various changes and modifications may be made based on what is described and illustrated.

What is claimed is:
1. An image sensor comprising:
a substrate;
image pixels formed in the substrate to form an image pixel array to detect incident light to provide optical image information, the image pixel array comprising:
image photodiodes formed in the substrate to detect incident light,
color filters formed over the substrate and vertically overlapping with the image photodiodes, respectively, each color filter structured to transmit light of a selected color that is designated a corresponding image photodiode, respectively; and
image micro lenses placed over the color filters, respectively; and
phase difference detection pixels formed in the substrate and located in the imaging pixel array at locations that are from the image pixels to detect light and to provide phase difference information for the optical image information provided by the image pixels, the phase difference detection pixels comprising:

phase difference detection photodiodes formed in the substrate to detect a portion of light incident to the image pixel array, transmitting layers formed over the substrate to allow optical transmission of light and patterned to vertically overlap with the phase difference detection photodiodes, respectively;

guide patterns formed between the substrate and the transmitting layers and structured to be optically opaque to block light incident to the guide patterns;

phase difference detection micro lenses formed over the transmitting layers to direct incident light to the phase difference detection photodiodes, respectively;

image overcoat layers formed between the color filters and the image micro lenses; and phase difference detection overcoat layers formed between the transmitting layers and the phase difference detection micro lenses, wherein the phase difference detection overcoat layers have a refractive index higher than the transmitting layers, wherein the transmitting layers have a refractive index lower than those of the color filters and the phase difference detection micro lenses.

2. The image sensor according to claim 1, wherein the phase difference detection photodiodes comprise a left phase difference detection photodiode and a right phase difference detection photodiode, wherein the guide patterns comprise a left guide pattern and a right guide pattern, and wherein the left guide pattern blocks a portion of the left phase difference detection photodiode, and the right guide pattern covers a portion of the right phase difference detection photodiode.

3. The image sensor according to claim 1, wherein the transmitting layers include a polymeric material, including at least one of a polystyrene-based resin, a polyimide-based resin, a polysiloxane-based resin, an acrylic-based resin, an epoxy-based resin, or a copolymer resin thereof.

4. The image sensor according to claim 1, further comprising:

grid patterns formed between the color filters and the transmitting layers, wherein the grid patterns and the guide patterns include a same material that is optically opaque.

5. The image sensor according to claim 4, wherein side surfaces of the grid patterns are in contact with lower portions of the color filters and lower portions of the transmitting layers.

6. The image sensor according to claim 1, wherein the image overcoat layers, the phase difference detection overcoat layers, the image micro lenses and the phase difference detection micro lenses have a same refractive index.

7. An image sensor comprising:

a substrate;

image pixels formed in the substrate to detect incident light and to provide optical image information, the image pixels comprising:

image photodiodes formed in the substrate to detect incident light;

color filters formed over the substrate and vertically overlapping with the image photodiodes, respectively, to transmit light of certain selected colors to corresponding image photodiodes, respectively; and image micro lenses over the color filters, and phase difference detection pixels formed in the substrate and located among the image pixels at locations that are different from the image pixels to detect light and to provide phase difference information for the optical image information provided by the image pixels, the phase difference detection pixels comprising:

phase difference detection photodiodes formed in the substrate to detect incident light;

transmitting layers formed over the substrate to allow optical transmission of light and patterned to vertically overlap with the phase difference detection photodiodes, respectively;

guide patterns formed between the substrate and the transmitting layers and structured to be optically opaque to block light incident to the guide patterns;

phase difference detection micro lenses formed over the transmitting layers to direct incident light to the phase difference detection photodiodes, respectively;

grid patterns formed between the color filters and the transmitting layers;

partition patterns over the grid patterns, wherein side surfaces of the partition patterns are in contact with upper portions of the color filters and upper portions of the transmitting layers, wherein the transmitting layers have a refractive index lower than those of the color filters and the phase difference detection micro lenses, wherein the grid patterns and the guide patterns include a same material that is optically opaque.

8. The image sensor according to claim 7, wherein the partition patterns have a refractive index lower than that of the color filters.

9. The image sensor according to claim 7, wherein the partition patterns include a silicon oxide.

10. The image sensor according to claim 7, wherein the phase difference detection pixels further comprise:

blind regions blocked by the left and right guide patterns, and openings not blocked by the left and right guide patterns; and partition patterns over the grid patterns between the color filters and the transmitting layers which are adjacent to the openings, and wherein the partition patterns have a refractive index lower than that of the color filters.

11. The image sensor according to claim 10, wherein the partition patterns have a refractive index higher than that of the transmitting layers.

12. An image sensor comprising:

isolation patterns formed in a substrate and defining areas in which image photodiodes and phase difference detection photodiodes are formed;

an antireflection layer formed over the substrate to direct incident light to the image photodiodes and phase difference detection photodiodes;

grid patterns formed over the antireflection layer and vertically aligned with the isolation patterns;

color filters and transmitting layers formed over the antireflection layer between the grid patterns, the color filters vertically overlapping with the image photodiodes and the transmitting layers vertically overlapping with the phase difference detection photodiodes;

overcoat layers over the color filters and the transmitting layers; and micro lenses over the overcoat layers and located to direct incident light to the image photodiodes and phase difference detection photodiodes, respectively, wherein the transmitting layers have a refractive index lower than the color filters and the micro lenses.

13. The image sensor according to claim 12, further comprising:
guide patterns interposed between the antireflection layer and the transmitting layers to block portions of the phase difference detection photodiodes,
wherein the portions blocked by the guide patterns provide blind regions and the guide patterns are disposed to provide openings between the guide patterns and the grid patterns.

14. The image sensor according to claim 13, further comprising:
partition patterns formed over the grid patterns,
wherein the grid patterns and the partition patterns separate the color filters from the transmitting layers.

15. The image sensor according to claim 14,
wherein the partition patterns surround side surfaces of the transmitting layers.

16. The image sensor according to claim 14,
wherein the partition patterns include a silicon oxide.

17. The image sensor according to claim 14,
wherein the partition patterns have a refractive index lower than the color filters.

18. The image sensor according to claim 13, further comprising:
partition patterns over the grid patterns which are adjacent to the openings,
and
wherein the partition patterns have a refractive index lower than the color filters, the overcoat layers and the micro lenses.

19. The image sensor according to claim 12, wherein the transmitting layers have a refractive index lower than the micro lenses.

* * * * *